(12) United States Patent
Mosalikanti et al.

(10) Patent No.: US 8,258,837 B2
(45) Date of Patent: Sep. 4, 2012

(54) CONTROLLED CLOCK PHASE GENERATION

(75) Inventors: Praveen Mosalikanti, Portland, OR (US); Nasser Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 12/640,842

(22) Filed: Dec. 17, 2009

(65) Prior Publication Data

US 2011/0148486 A1    Jun. 23, 2011

(51) Int. Cl.
    *H03L 7/06* (2006.01)
(52) U.S. Cl. .................................. 327/158; 327/149
(58) Field of Classification Search .................. 327/149, 327/158
    See application file for complete search history.

(56) References Cited

U.S. PATENT DOCUMENTS

| | | | |
|---|---|---|---|
| 7,292,631 B2 * | 11/2007 | Gregorius | 375/232 |
| 2004/0247025 A1 * | 12/2004 | Gregorius | 375/232 |
| 2009/0134918 A1 * | 5/2009 | Tzeng | 327/106 |
| 2009/0243679 A1 * | 10/2009 | Smith et al. | 327/158 |
| 2009/0251976 A1 * | 10/2009 | Amarilio et al. | 365/189.15 |
| 2010/0067633 A1 * | 3/2010 | Den Besten | 375/373 |
| 2010/0156459 A1 * | 6/2010 | Plants et al. | 326/39 |
| 2010/0225370 A1 * | 9/2010 | Demone | 327/158 |
| 2011/0018601 A1 * | 1/2011 | Yoshizawa et al. | 327/158 |
| 2011/0074477 A1 * | 3/2011 | Nagarajan et al. | 327/158 |
| 2011/0144941 A1 | 6/2011 | Roberts et al. | |

OTHER PUBLICATIONS

Bucher, et al. "A Synthesizable VHDL Model of the Exact Solution for Three-Dimensional Hyperbolic Positioning System," VLSI Design, 2002, vol. 15 (2), pp. 507-520.

* cited by examiner

*Primary Examiner* — Lincoln Donovan
*Assistant Examiner* — Adam Houston
(74) *Attorney, Agent, or Firm* — Garrett IP, LLC

(57) ABSTRACT

Methods and systems to generate multiple phases of a clock may include a delay locked loop (DLL) to generate a bias signal to control a delay time through DLL delay elements in response to a first clock, and a plurality of a quadrature slave delay lines (SDLs), each to generate a plurality of successively phase shifted clocks over a quadrant of a corresponding selected phase of a second clock. The SDLs may be biased with the DLL bias signal to control phase differences between the generated clocks. One or more phase interpolators, such as contention based phase interpolators, may be coupled to outputs of each SDL. A frequency of the second clock may be equal to or greater than a frequency of the first clock. The SDLs may be implemented with fewer delay elements than the DLL.

18 Claims, 9 Drawing Sheets

# CONTROLLED CLOCK PHASE GENERATION

BACKGROUND

Clock and data recovery (CDR) systems have been implemented to align a sample clock with a data stream.

Where a sample rate of approximately 4 GHz is utilized, adjustment step sizes of approximately 2 pico seconds (ps) may be desirable.

A CDR may include a phase interpolator to interpolate between multiple phases of a reference clock, to generate a sample clock that is approximately aligned with a data stream.

Conventional CDR systems utilize phase interpolators to interpolate between clock phases that are relatively widely spaced, such as 90°. Phase interpolators designed to provide relatively fine resolution or step sizes from relatively widely spaced reference clock phases consume relatively significant amounts of power and area. A contention based phase interpolator may consume less power than other types of phase interpolators, but cannot interpolate well between relatively widely spaced clocks, which results in relatively poor linearity.

BRIEF DESCRIPTION OF THE DRAWINGS/FIGURES

Figure 1:
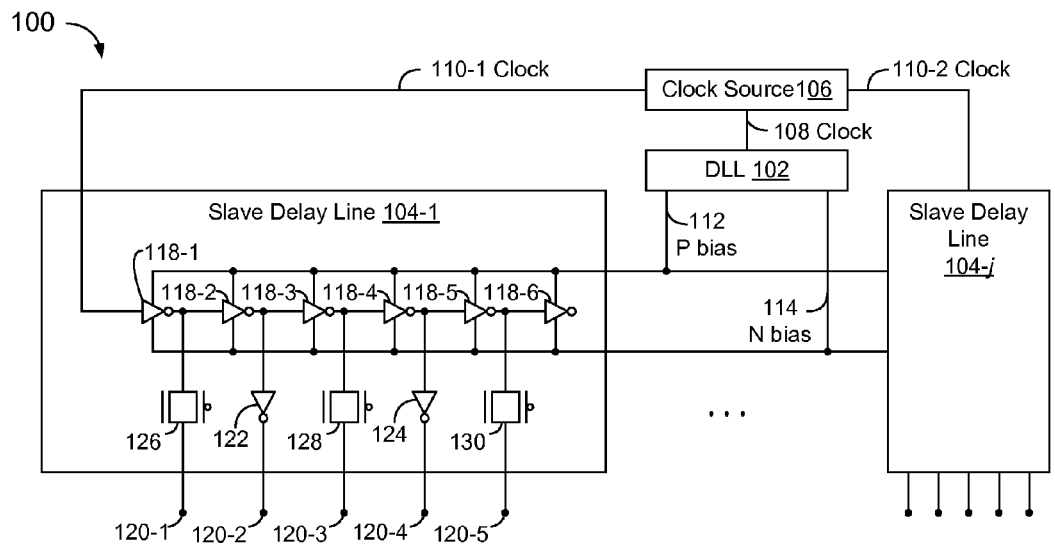
FIG. 1 is a block diagram of a clock generator system, including a delay locked loop (DLL) and one or more slave delay lines (SDLs) biased by the DLL.

In the drawings, the leftmost digit(s) of a reference number identifies the drawing in which the reference number first appears.

DETAILED DESCRIPTION

Disclosed herein are methods and systems to generate phase shifted clocks, which may be employed with contention based phase interpolators.

FIG. 1 is a block diagram of a clock generator system 100, including a delay locked loop (DLL) 102, one or more slave delay lines (SDLs) 104 biased by DLL 102, and a clock source 106 to provide a first clock 108 to DLL 102 and a second clock 110 to SDLs 104. A frequency of clock 108 may be equal to or less than a frequency of clock 110, such as described in examples below.

SDL 104-1 includes a plurality of delay elements 118 to generate a plurality of successively phase shifted clocks from clock 110, within a portion of a period of clock 110, and to output the generated clocks as clock outputs 120. A delay time through delay elements 118 may be controlled by one or more bias signals from DLL 102, such as described further below. DLL 102 may effectively serve as a master delay locked loop to SDL 104-1.

SDL 104-1 may be configured to generate the plurality of successively phase shifted clocks within one or more quadrants of clock 110. Exemplary operation of SDL 104-1 with respect to a quadrant of clock 110 is described below with respect to FIG. 2.

Multiple phases of clock 110 may be selectively applied to SDL 104-1 to generate the plurality of successively phase shifted clocks in multiple quadrants of clock 110. Exemplary operation of SDL 104-1 with respect to multiple phases of clock 110 is described below with respect FIGS. 3 and 4.

In the example of FIG. 1, SDL 104-1 includes six delay elements 118-1 through 118-6, and five clock outputs 120-1 through 120-5. Delay element 118-1 may serve as a pre-conditioning element, and delay element 118-6 may serve as a load matching element, such as to ensure that inputs and outputs of delay elements 118-2 through 118-5, and corresponding clock outputs 120, have similar load characteristics.

In FIG. 1, delay elements 118 are illustrated as inverting delay elements. Where adjacent taps between delay elements 118 are inverted relative to one another, as in FIG. 1, SDL 104-1 may include inverting elements 122 and 124 to provide a common polarity amongst clock outputs 120. SDL 104-1 may further include non-inverting delay elements 126, 128, and 130 to match delays of inverting elements 122 and 124. Non-inverting elements 126, 128, and 130 may include, for example, N and P type devices configured as pass gates.

One or more additional SDLs 104-2 through 104-j may be configured similar to SDL 104-1.

SDLs 104 are not limited to the example of FIG. 1.

DLL 102 may be configured to generate one or more bias signals, illustrated here as P bias 112 and N bias 114, in response to a delay of signal 108 through DLL 102. Bias signals P bias 112 and N bias 114 may correspond to voltage levels applied across delay elements of DLL 102 to control rise and/or fall times of signal 108, and to thus control a delay time of signal 108 through the delay elements, as is well known.

P bias 112 and/or N bias 114 may be applied to delay elements 118 of SDLs 104 to control a corresponding delay time through each of delay elements 118.

DLL 102 may be configured to control P bias 112 and/or N bias 114 to maintain a desired phase difference between clock outputs 120, and to maintain clock outputs 120 within a desired quadrant of clock 110. The quadrant may correspond to a 0° through 90° quadrant of clock 110, or a slightly phase shifted quadrature thereof.

Figure 2:
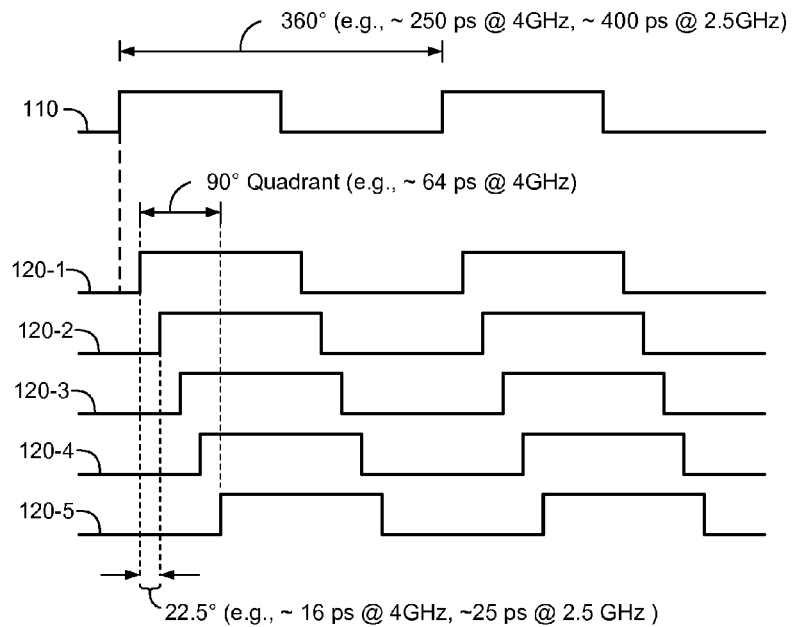
FIG. 2 is a timing diagram of a reference clock and corresponding output clocks.

FIG. 2 is timing diagram of clock 110, and corresponding output clocks 120-1 through 120-5.

In the example of FIG. 2, clock outputs 120-1 through 120-5 are substantially equally spaced clocks at approximately 22.5° increments, over an approximately 0°-90° quadrant of clock 110. Additional delay elements 118 may be included to provide clocks in one or more additional quadrants of clock 110.

Clock 110 may have a frequency of, for example, approximately 4 GHz, such as in a peripheral component in an expansion of PCIe (peripheral component interconnect express) 3.0 environment. At 4 GHz, 22.5° corresponds to approximately 16 ps. In this example, DLL 102 may be configured to control P bias 112 and/or N bias 114 to maintain a delay of approximately 16 ps through each of delay elements 118.

As another example, clock 110 may have a frequency of 2.5 GHz, such as in a PCIe 2.0 environment. At 2.5 GHz, 22.5° corresponds to approximately 25 ps. In this example, DLL 102 may be configured to control P bias 112 and/or N bias 114 to maintain a delay of approximately 25 ps through each of delay elements 118.

Delay elements 118 and delay elements within a delay line of DLL 102 may have substantially similar delay characteristics, which may include similar process, voltage and/or temperature variations. Delay elements 118 and the delay elements within DLL 102 may be fabricated on common chip or die, or fabricated over a plurality dies having similar characteristics.

Where delay elements 118 and delay elements within the delay line of DLL 102 have substantially similar delay characteristics, DLL 102 may be configured to control P bias 112 and/or N bias 114 to maintain a delay through each of the delay elements of DLL 102 substantially equal to a desired delay through each of delay elements 118.

Where delay characteristics of delay elements 118 differ from delay characteristics of delay elements within the delay line of DLL 102, system 100 may be configured to make corresponding adjustments to P bias 112 and/or N bias 114.

A number of delay elements within DLL 102 may be related to a number of intervening delay elements within SDL 104-1, where intervening delay elements are defined as delay elements between adjacent clock outputs 120, such as delay elements 118-2, 118-3, 118-4, and 118-5. Where SDL 104-1 is configured to generate output clocks 120 over a quadrant of clock 110, intervening delay elements 118-2 through 118-5 are referred to herein individually as quadrature delay elements, and together as a quadrature delay line.

The number of delay elements within DLL 102 and the number of intervening delay elements within SDL 104-1 may be further related to the frequencies of clocks 108 and 110, and/or related to a difference therebetween.

For example, where the frequency of the clock 110 is substantially equal to the frequency of clock 108 in a quadrature implementation, DLL 102 may include approximately four times as many delay elements as the number of quadrature delay elements. In FIG. 1, where SDL 104-1 includes four intervening delay elements 118-2 through 118-5, DLL 102 may include 16 similar inverting delay elements or 8 non-inverting delay stages.

Where the frequency of signals 108 and 110 are approximately 4 GHz, the 16 inverting delay elements of DLL 102 may each be controlled to provide a delay of approximately 16 ps, or the 8 non-inverting delay elements or stages may each be controlled to provide a delay of approximately 32 ps.

Where the frequency of clocks 108 and 110 are approximately 2.5 GHz, the 16 inverting delay elements of DLL 102 may each be controlled to provide a delay of approximately 25 ps, or the 8 non-inverting delay elements or stages may each be controlled to provide a delay of approximately 50 ps.

As another example, where the frequency of the clock 110 is approximately twice the frequency of clock 108 in a quadrature implementation, DLL 102 may include eight times as many delay elements as a number of quadrature delay elements 118. In FIG. 1, where SDL 104-1 includes four intervening delay elements 118-2 through 118-5, DLL 102 may include 32 similar inverting delay elements or 16 non-inverting delay stages.

Where the frequency of clock 110 is approximately 4 GHz and the frequency of clock 108 is approximately 2 GHz, the 32 inverting delay elements of DLL 102 may each be controlled to provide a delay of approximately 16 ps, or the 16 non-inverting delay elements or stages may each be controlled to provide a delay of approximately 32 ps.

Where the frequency of clock 110 is approximately 2.5 GHz and the frequency of clock 108 is approximately 1.25 GHz, the 16 inverting delay elements of DLL 102 may each be controlled to provide a delay of approximately 25 ps, or the 8 non-inverting delay elements or stages may each be controlled to provide approximately 50 ps of delay.

A quadrature delay line 104 may thus be implemented with substantially fewer delay elements than DLL 102, and/or DLL 102 may be operated at a lower frequency than SDLs 104, which may reduce area requirement and/or power consumption.

Based on the examples herein, one skilled in the art will understand that the number of delay elements in a quadrature delay line 104 and DLL 102, and the frequencies of first and second clocks 108 and 110, may be varied to vary the number and phase spacing of clocks 120, and/or to accommodate differences between delay elements 118 and delay elements of DLL 102.

As described below with reference to FIGS. 3 and 4, clock source 106 may be configured to output a plurality of quadrature clocks, and SDLs 104 may be configured to selectively switch amongst the quadrature clocks to generate clocks over multiple quadrants.

As described below with reference to FIGS. 5 though 8, clock outputs 120 from one or more SDLs 104 may be provided to one or more corresponding phase interpolators to interpolate between selected subsets of clock outputs 120.

Figure 3:
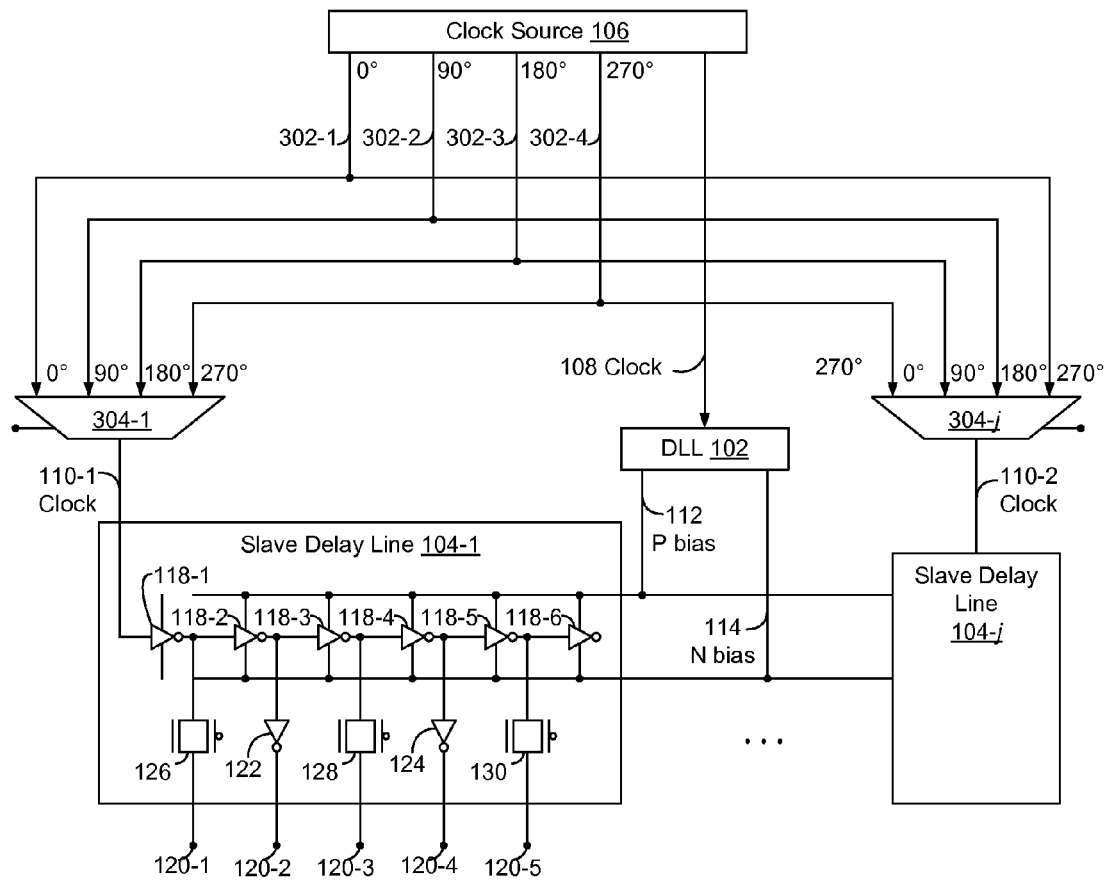
FIG. 3 is a block diagram of the system, wherein the reference clock includes a plurality of selectable quadrature clocks to permit the one or more SDLs to generate clock in multiple quadrants.

FIG. 3 is a block diagram of system 100, wherein clock source 106 is configured to output quadrature clocks 302-1 through 301-4, having relative phases of 0°, 90°, 180°, and 270°, respectively. System 100 further includes one or more multiplexers 304, to selectively provide quadrature clocks 302 to corresponding SDLs 104 as clocks 110. As described below with reference to FIG. 4, each SDL 104 may generate output clocks 120 in multiple quadrants in response to selected clocks 302-1 through 302-4.

Figure 4:
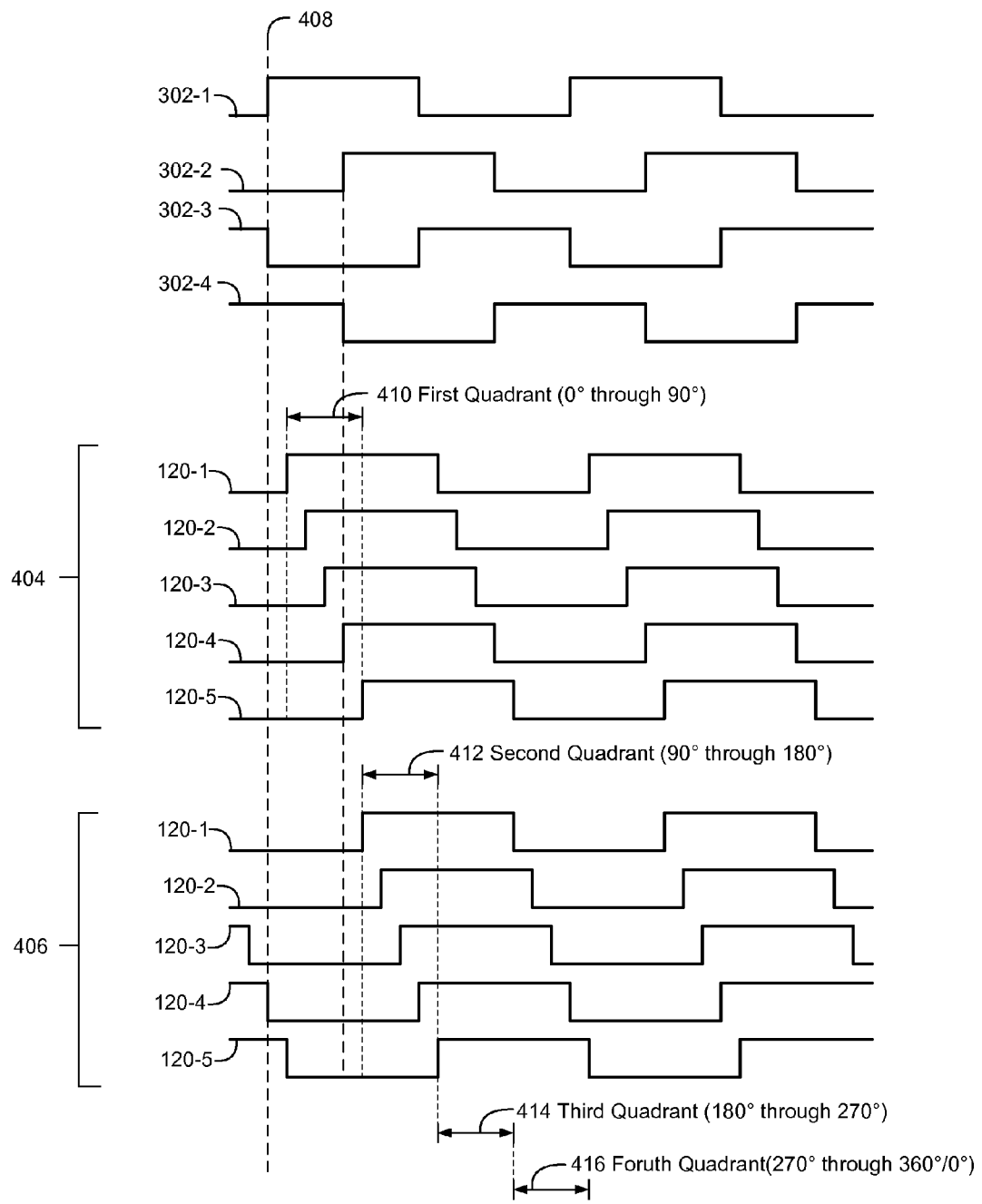
FIG. 4 is a timing diagram depiction of quadrature clocks and corresponding output clocks.

FIG. 4 is a timing diagram of quadrature clocks 302, and corresponding output clocks 120-1 through 120-5 at 404 and 406. Clocks 120 at 404 are generated from 0° quadrature clock 302-1. Clocks 120 at 406 are generated from 90° quadrature clock 302-2.

At 404, output clocks 120-1 through 120-5 are distributed over a 90° quadrant 410 bounded by clocks 302-1 and 302-2.

At 406, output clocks 120-1 through 120-5 are distributed over a 90° quadrant 412 of clock 302-2.

Similarly, output clocks 120-1 through 120-5 generated from clock 302-3 will be distributed over a 90° quadrant 414 of clock 302-3, and output clocks 120-1 through 120-5 generated from clock 302-4 will be distributed over a 90° quadrant 416 of clock 302-4.

The 90° quadrant 410 corresponds to a 0° through 90° quadrant relative to reference 408.

The 90° quadrant 412 corresponds to a 90° through 180° quadrant relative to reference 408.

The 90° quadrant 414 corresponds to a 180° through 270° quadrant relative to reference 408.

The 90° quadrant 416 corresponds to a 270° through 360°, or 0° quadrant relative to reference 408.

In FIG. 3, system 100 is thus configured to generate output clocks 120 in all four quadrants of a reference phase.

Figure 5:
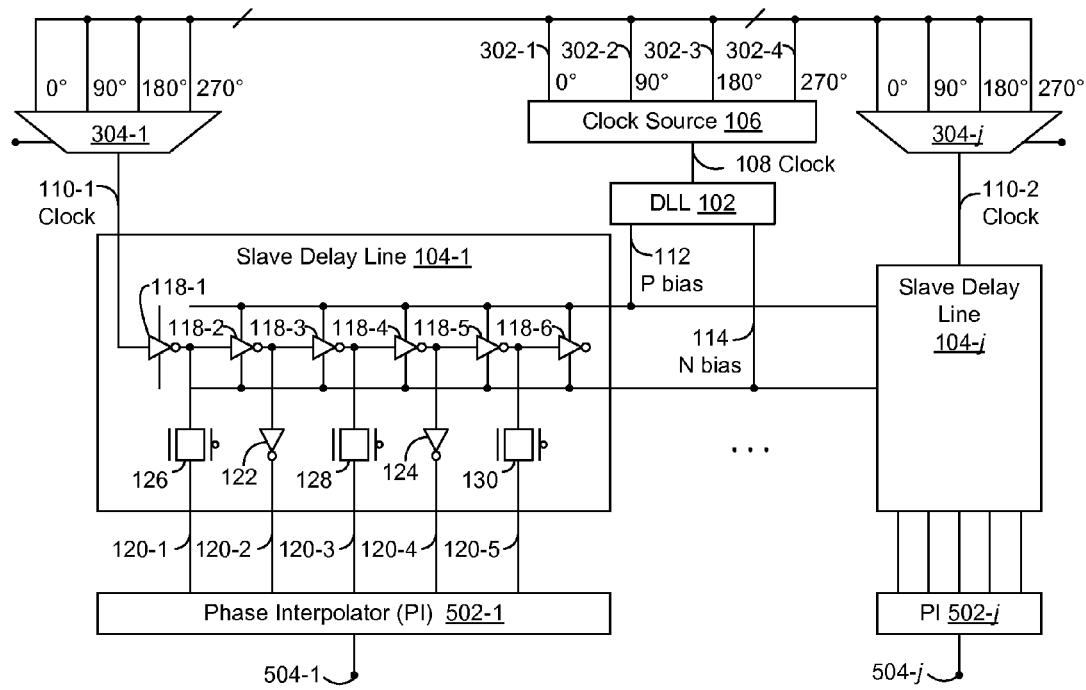
FIG. 5 is a block diagram of the system, further including one or more phase interpolators.

FIG. 5 is a block diagram of system 100, further including one or more phase interpolators (PIs) 502, to interpolate between selected subsets of corresponding clock outputs 120, and to generate a corresponding phase interpolated clock output 504.

PIs 502 may include contention based PIs, which may be configured to interpolate between a selected pair of adjacent clock outputs 120, such as described below with respect to FIG. 6.

Figure 6:
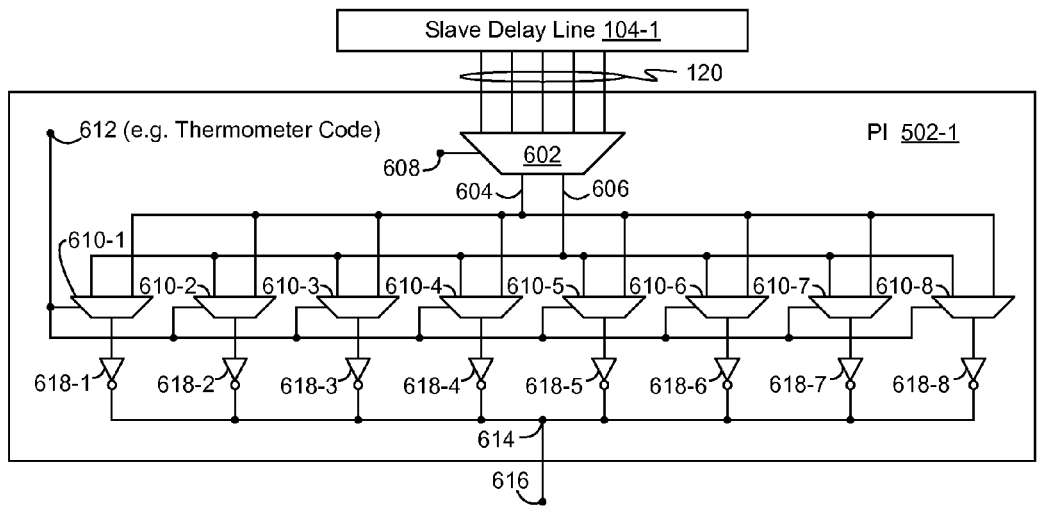
FIG. 6 is a block diagram of a contention based phase interpolator.

FIG. 6 is a block diagram of PI 502-1, illustrated here as a contention based PI, to interpolate between a selected pair of clock outputs 120 of SDL 104-1.

In FIG. 6, PI 502-1 includes a multiplexer 602 to selectively output an adjacent pair of clock outputs 120 as clocks 604 and 606 in response to a control 608.

PI 502-1 further includes a plurality of multiplexers 610, each to selectively output one of clocks 604 and 606 in response to corresponding controls 612. Controls 612 may be in the form of a thermometer code to control a first portion of multiplexers 610 to output clock 604 and to control a remaining portion of multiplexers 610 to output clock 606.

PI 502-1 further includes a summation node 614 to combine outputs of multiplexers 610, and to provide a corresponding clock 616 having a phase equal to or between a phase of clocks 604 and 606. The phase of clock 616 may vary in proportion to a ratio of multiplexers 610 that output clock 604 and multiplexers 610 that output clock 606.

Resolution of output clock 604 depends in part on the number of contention stages, or multiplexers 610.

As described above with respect to FIG. 2, an adjacent pair of clock outputs 120 may have a phase difference in a range of, for example and without limitation, 16 ps to 25 ps.

Resolution may be increased with additional multiplexers 110, or decreased with fewer multiplexers 610.

For example, and without limitation, where clocks 604 and 606 have a phase separation of 16 ps, an 8 stage contention based PI, such as illustrated in FIG. 6, may provide an incremental phase step size of approximately 2 ps. A 16 stage contention based PI provide an incremental step size of approximately 1 ps.

As another example, where clocks 604 and 606 have a phase separation of 25 ps, an 8 stage contention based PI, such as illustrated in FIG. 6, may provide an incremental step size of approximately 3.125 ps. A 16 stage contention based PI may provide an incremental step size of approximately 1.6 ps.

PI 502-1 may include buffers, illustrated here as inverters 618, to buffer outputs of multiplexers 610 prior to summation node 614.

System 100 may be implemented as part of a multi-lane system, and a plurality of PIs 502 may be associated with each SDL 104 to generate corresponding data and edge sample clocks, such as described below with respect to FIGS. 7 and 8.

Figure 7:
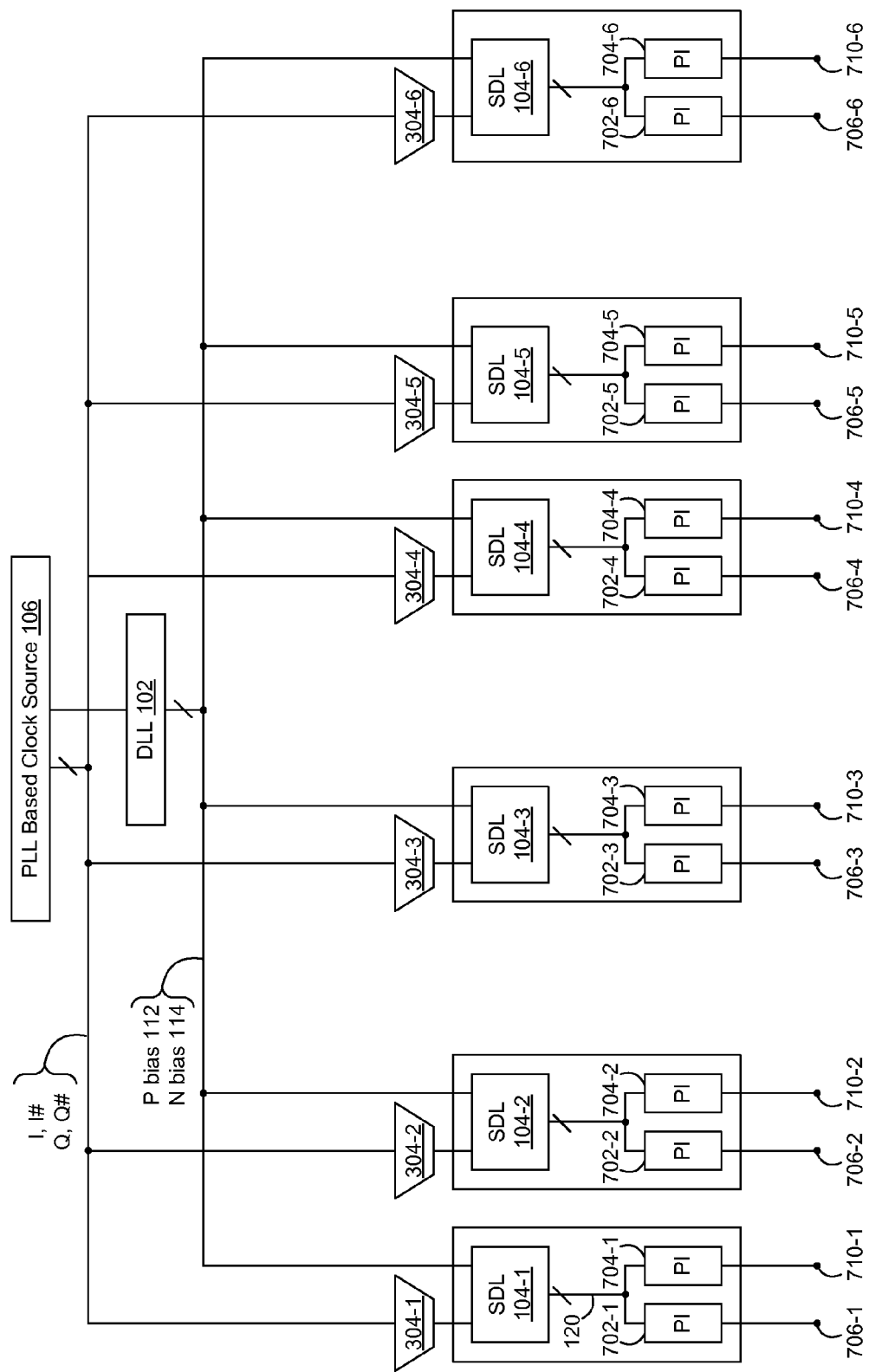
FIG. 7 is a block diagram of the system, further including an edge clock phase interpolator and a data clock phase interpolator.

FIG. 7 is a block diagram of system 100, including an edge clock PI 702 and a data clock PI 704 associated with each SDL 104.

Each edge clock PI 702 may be configured to generate an edge sample clock 706 and a complementary edge clock 708 for a corresponding receive lane. Each data clock PI 704 may be configured to generate a data sample clock 710 and a complementary data clock 712 for the corresponding receive lane. Each edge clock 706 and corresponding data clock 710 may be separated by approximately 90°, as described below with reference to FIG. 8.

Figure 8:
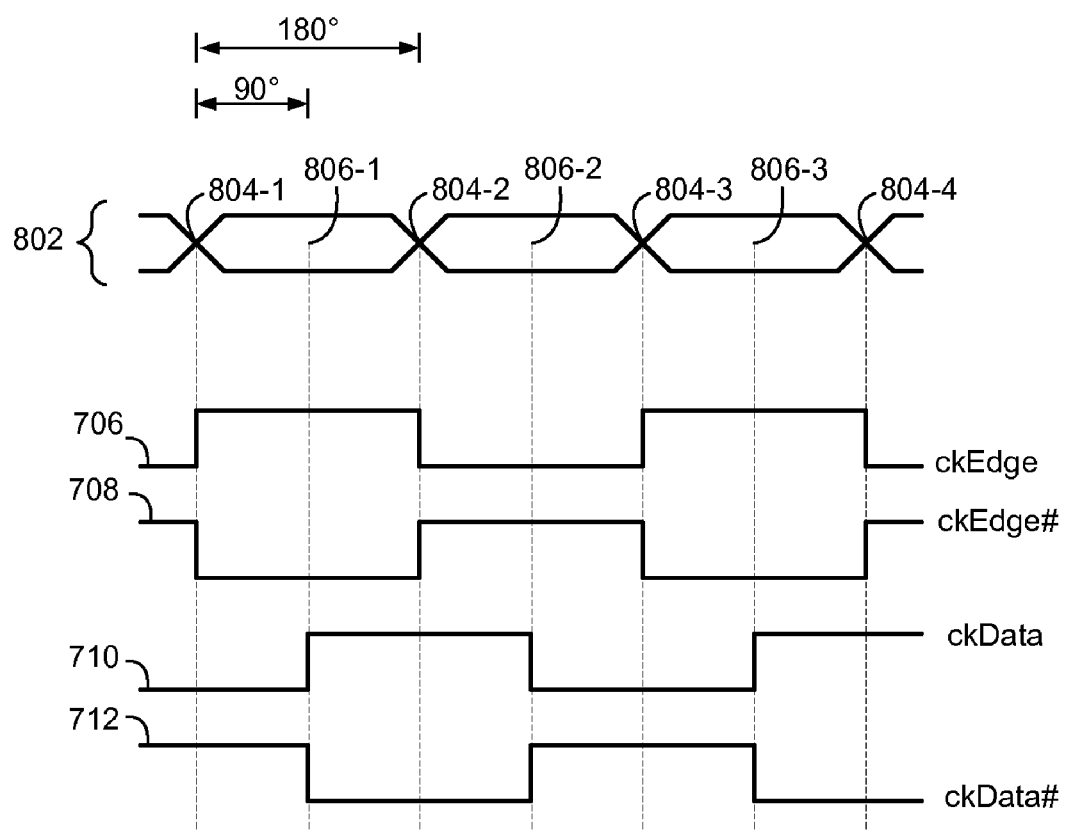
FIG. 8 is a timing diagram of a data stream, an edge clock, a complementary edge clock, a data clock, and a complementary data clock.

FIG. 8 is a timing diagram of a data signal 802, having data transitions 804 and data eye centers 806 between data transitions 804. FIG. 8 also depicts edge clock 706, complementary edge clock 708, data clock 710, and complementary data clock 712.

Data clocks 710 and 712 may be used to obtain data samples of data signal 802. Edge clocks 706 and 708 may be used to obtain edge samples of data signal 802. System 100 may include a clock and data recovery (CDR) system to use the edge samples to align edge clocks 706 and 708 with data transitions 804. When rising edges of edge clocks 706 and 708 are in alignment with corresponding data transitions 804, and when the phase difference between edge clock 706 and data clock 710 is approximately 90°, rising edges of data clocks 710 and 710 are substantially in alignment with data eye centers 806.

In FIG. 7, a CDR system may be configured to control multiplexer 304 and corresponding PIs 702 and 704 with respect to corresponding received data signals 802.

Figure 9:
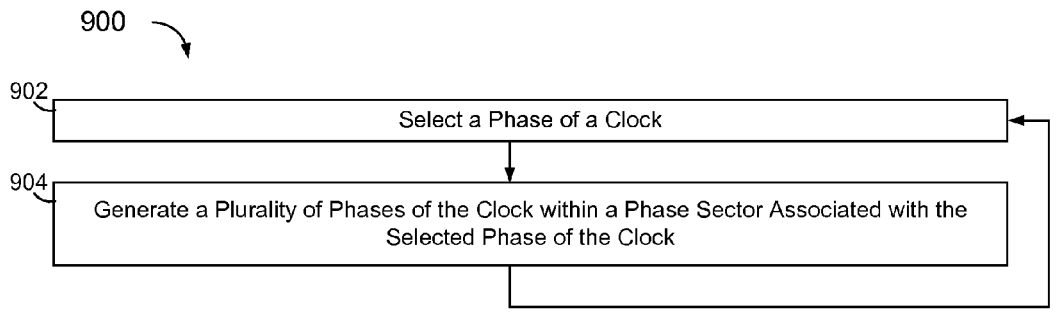
FIG. 9 is a process flowchart of a method of generating a plurality of successively delayed clocks within a phase sector of a reference clock.

FIG. 9 is a process flowchart of a method 900 of generating a plurality of successively delayed clocks within a phase sector of a reference clock.

At 902, a phase of the reference clock is selected. The phase of the reference clock may be selected from a set of set of equally spaced phases of the reference clock, such as quadrature phases, which may correspond to 0°, 90°, 180°, and 270° degree phases of the reference clock.

At 904, a plurality of phases of the reference clock is generated within a phase sector associated with the selected phase of the reference clock. Where the phase sectors correspond to quadrature phase sectors, for example, and where the selected phase corresponds to a 0° phase of the reference clock, the plurality of phases may be generated in a quadrature of 0° to 90° degrees of the reference clock. Where the selected phase corresponds to a 90° phase of the reference clock, the plurality of phases may be generated in a quadrature of 90° to 180° degrees of the reference clock.

The selecting at 902 and the generating at 902 may be repeated for one or more other phases of the reference clock, to generate multiple sets of phases of the clock in multiple phase sectors of the reference clock.

Figure 10:
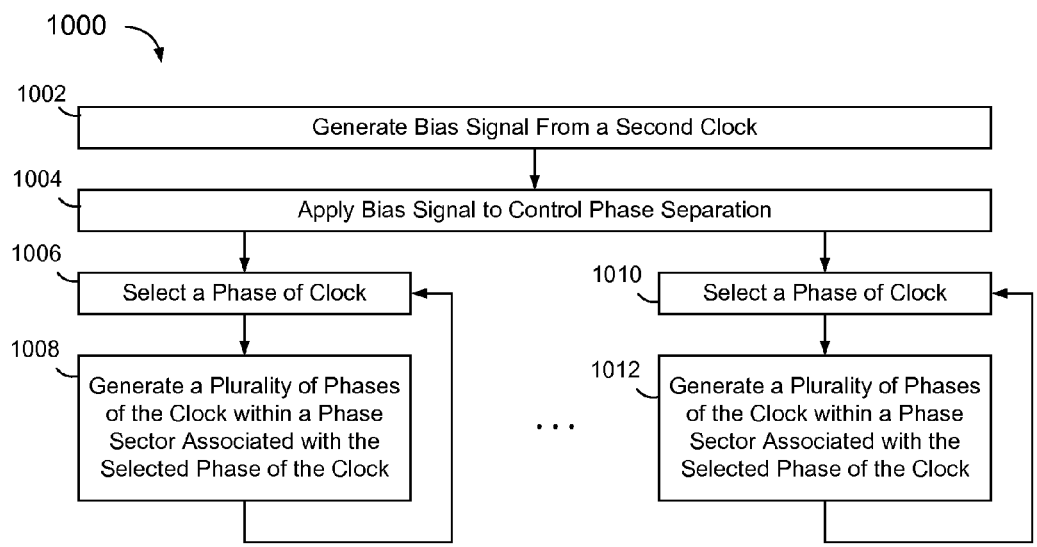
FIG. 10 is a process flowchart of a method of performing multiple instances of method 900.

FIG. 10 is a process flowchart of a method 1000 of performing multiple instances of method 900. Method 1000 may be implemented, for example, as part of a multi-receive lane communication system, such as to generate and provide clock signals to each of a plurality of phase interpolators associated with the plurality of receive lanes.

At 1002, a bias signal is generated from a reference second clock. The bias signal may be generated to control a delay time of the second clock through a delay locked loop (DLL). A frequency of the second reference clock may be greater than, equal to, or less than a frequency of the first reference clock.

At 1004, the bias signal is used to control a phase separation in each of a plurality of phase generation processes, such as described below with respect to 1008 and 1012. Generating a common bias signal for a plurality of phase generation processes, rather than generating a separate bias signal for each of the processes, may reduce overall power consumption.

At 1006, a phase of a first reference clock is selected, such as described above with respect to 902.

At 1008, a plurality of phases of the first reference clock is generated within a phase sector associated with the phase selected at 1006, such as described above with respect to 904.

The selecting at 1006 and the generating at 1008 may be repeated for one or more other phases of the first reference clock, to generate multiple sets of phases of the first reference clock in multiple phase sectors.

One or more additional instances of the selecting at 1006 and the generating at 1008 may performed, substantially independent of one another, such as illustrated at 1010 and 1020.

Figure 11:
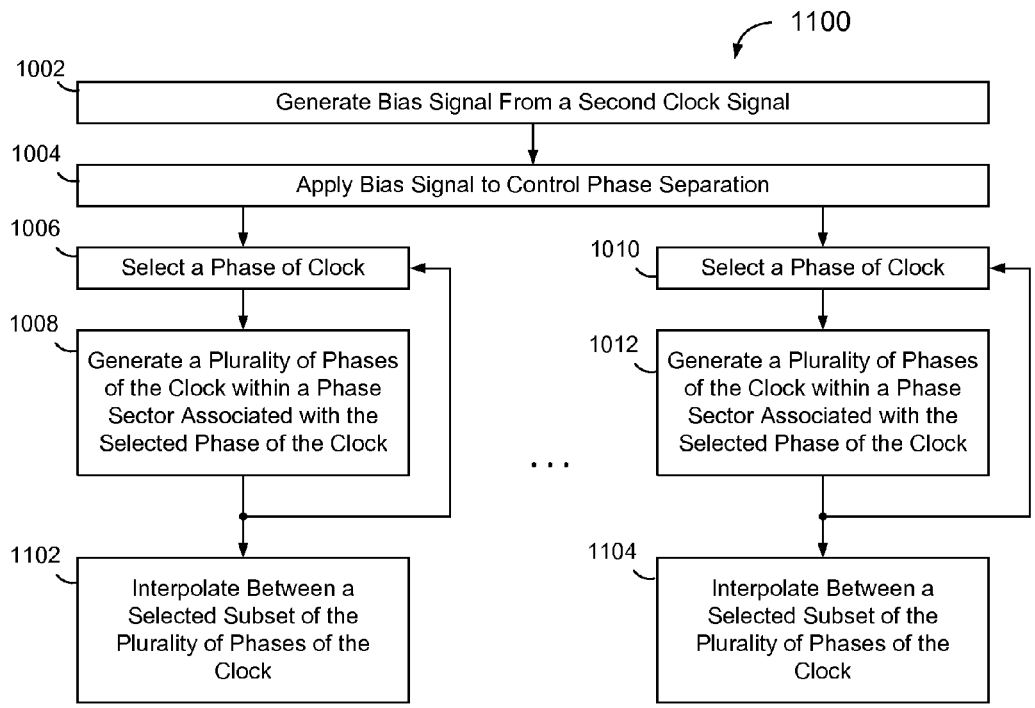
FIG. 11 is a process flowchart of a method of performing multiple instances of method 900, such as illustrated in FIG. 10, and of interpolating between selected subsets of generated clock signals.

FIG. 11 is a process flowchart of a method 1100 of performing multiple instances of method 900, such as illustrated in FIG. 10, and of interpolating between selected subsets of generated clock signals.

At 1102, a first interpolation is performed between a selected subset of the plurality of clock phases generated at 1008.

At 1104, a second interpolation is performed between a selected subset of the plurality of clock phases generated at 1010.

The subsets of clock phases may be selected and interpolated at 1102 and 1104 under control of corresponding CDR systems associated with corresponding receive lanes, such as to generate one or more of an edge clock and a data clock aligned with corresponding data signals.

The interpolating at 1102 and 1104 may be performed with respective contention based phase interpolators. The generating of the plurality of phases of the reference clock with selected phase sectors of the first reference clock, such as described above, may provide relatively finely spaced phases of the reference clock to the contention based phase interpolators.

Figure 12:
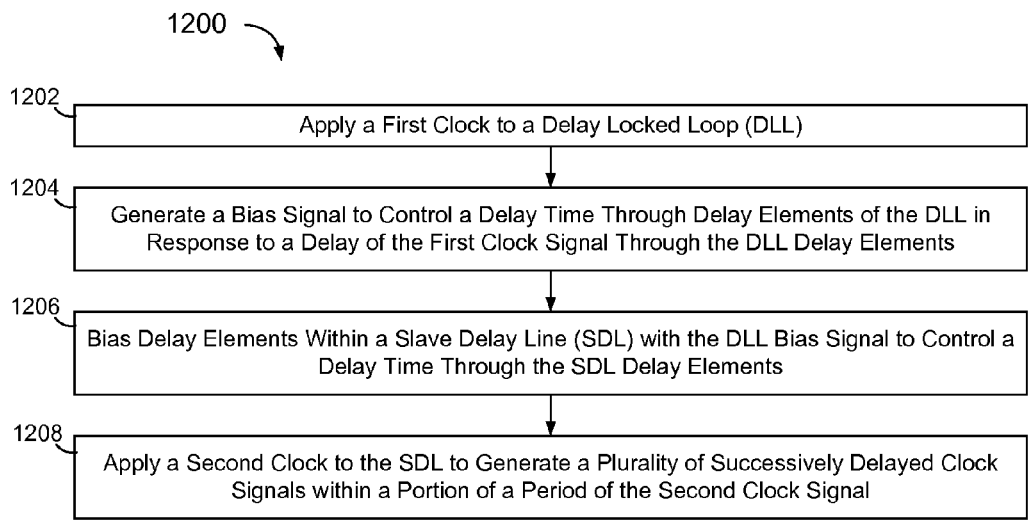
FIG. 12 is a process flowchart of a method of generating a plurality of successively delayed clocks within a portion of a period of a reference clock.

FIG. 12 is a process flowchart of a method 1200 of generating a plurality of successively delayed clocks within a portion of a period of a reference clock.

At 1202, a first clock is applied to a delay locked loop (DLL).

At 1204, a bias signal is generated to control a delay time through delay elements of the DLL in response to a delay of the first clock through the DLL delay elements.

At 1206, delay elements within a slave delay line (SDL) are biased with the DLL bias signal to control a delay time through the SDL delay elements, effectively biasing the SDL delay elements as a function of the delay through the DLL delay elements.

The biasing of the delay elements within the SDL at 1206 may include controlling the delay time through each of the delay elements of the SDL to be substantially equal to the delay time through each of the delay elements of the DLL.

At 1208, a second clock is applied to the SDL to generate a plurality of successively delayed clocks within a portion of a period of the second clock. A frequency of the second clock may be equal to or greater than a frequency of the first clock. The portion of the period of the second clock signal may correspond to a quadrant of the second clock signal.

Figure 13:
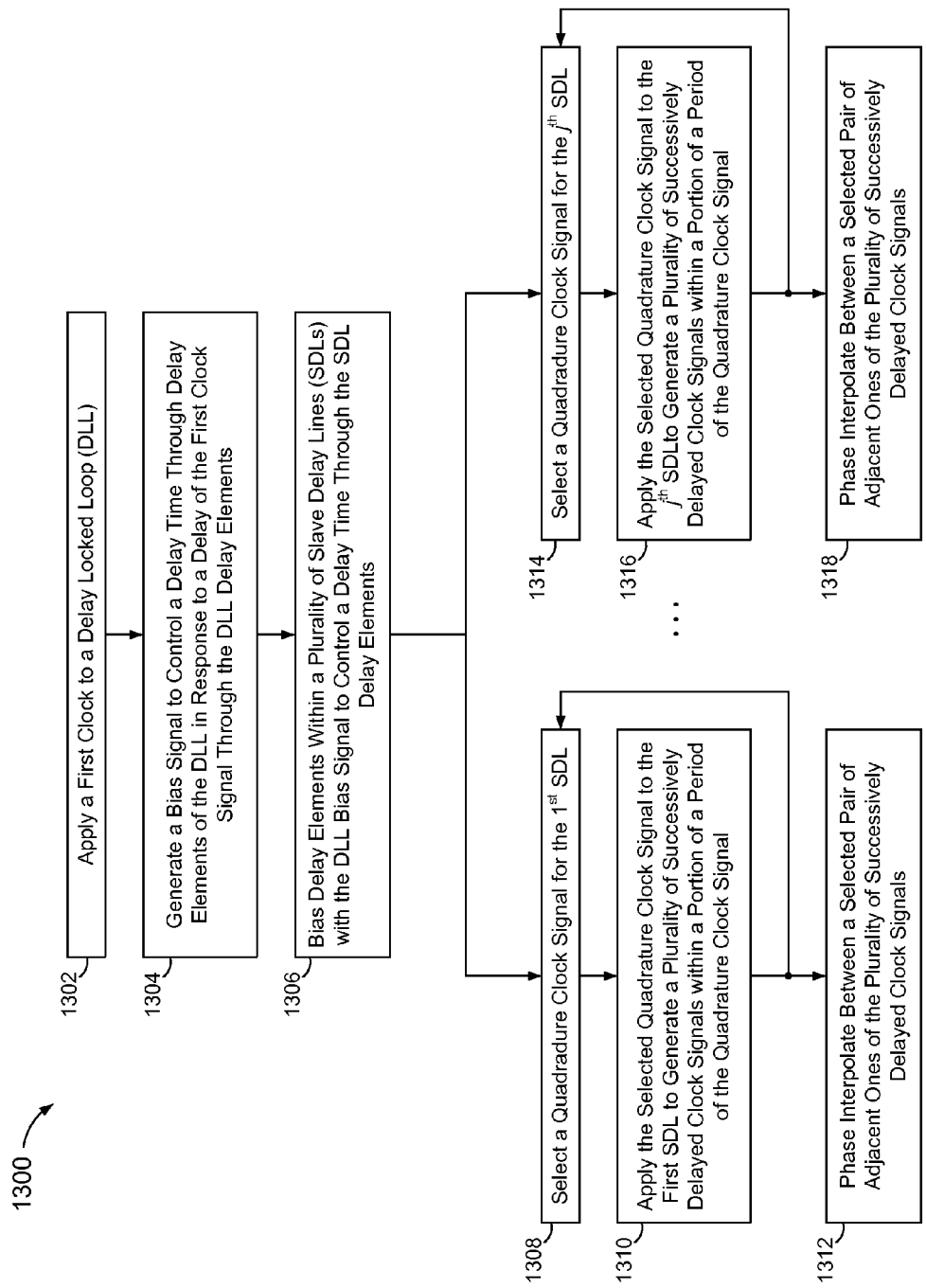
FIG. 13 is a process flowchart of a method of generating clocks within selected quadrants of a reference clock, for each of a plurality of processing lanes.

FIG. 13 is a process flowchart of a method 1300 of generating a plurality of successively delayed clocks within multiple selected quadrants of a reference clock, for each of a plurality of processing lanes. Method 1300 is not limited to exemplary system disclosed herein.

At 1302, a first clock is applied to a delay locked loop (DLL).

At 1304, a bias signal is generated to control a delay time through delay elements of the DLL in response to a delay of the first clock through the DLL delay elements.

At 1306, delay elements within a plurality of slave delay lines (SDLs) are biased with the DLL bias signal to control delay times through the SDL delay elements, effectively biasing the SDL delay elements as a function of the delay through the DLL delay elements.

The biasing of the delay elements within the SDL at 1306 may include controlling the delay time through each of the delay elements of the SDL to be substantially equal to the delay time through each of the delay elements of the DLL.

At 1308, one of a plurality of quadrature clocks is selected for a first one of the SDLs. A frequency of the quadrature clocks may be equal to or greater than a frequency of the first clock.

At 1310, the selected quadrature clock is applied the first SDL to generate a plurality of successively delayed clocks within a portion of a period of the selected quadrature clock. The portion may correspond to a quadrant of the selected quadrature clock.

At 1312, phase interpolation is performed between a selected pair of adjacent ones of the successively delayed clocks, to generate a clock having a phase equal to or between phases of the selected pair of clocks. The phase interpolating at 1312 may include multiple phase interpolations, such as to generate an edge sample clock and a data sample clock as described above with respect to FIG. 8.

The selecting at 1308, the applying at 1310, and the phase interpolating at 1312 may be repeated for one or more additional SDLs, as illustrated at 1314, 1316, and 1318, respectively.

Methods and system disclosed herein may be implemented with full-swing signals throughout, which may provide more reliable operation relative to systems that utilize low-swing signals, and which may permit use debug techniques designed to analyze full-swing signals.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A system, comprising:
    a first selector to selectively provide one of multiple phases of a source clock as a first selected clock based on a first control; and
    a first delay line including a plurality of delay elements to generate a corresponding plurality of phases of the first selected clock within one of multiple phase sectors of the first selected clock.

2. The system of claim 1, wherein the delay line includes a quadrature delay line to generate the plurality of phases of the first selected clock within an approximately ninety degree phase quadrant of the first selected clock.

3. The system of claim 1, further including a delay locked loop (DLL) to bias delay elements of the first delay line, wherein an operating frequency of the DLL is equal to a frequency of the source clock, multiplied by a ratio of a number of non-inverting delay stages of the DLL to a number of the phases generated by the delay line, multiplied by 2.

4. The system of claim 1, further including a delay locked loop (DLL) to bias delay elements of the delay line, wherein an operating frequency of the DLL is less than a frequency of the source clock.

5. The system of claim 1, further including a delay locked loop (DLL) to bias delay elements of the delay line, wherein an operating frequency of the DLL is no more than approximately one-half of a frequency of the source clock.

6. The system of claim 1, further including a phase interpolator, including:
    a first multiplexer and a plurality of second multiplexers, the first multiplexer to output selectable first and second ones of the plurality of phases of the first selected clock to each of the second multiplexers, each of the second multiplexers to output a selectable one of the first and second phases to a summation node.

7. The system of claim 1, further including:
    a second selector to output one of the multiple phases of the source clock as a second selected clock based on a second control;
    a second delay line to generate a plurality of phases of the second selected clock within one of multiple phase sectors of the second selected clock; and
    a delay locked loop (DLL) to bias delay elements of the first and second delay lines.

8. The system of claim 7, wherein an operating frequency of the DLL is equal to a frequency of the source clock, multiplied by a ratio of a number of non-inverting delay stages of the DLL to a number of the plurality of phases generated by each of the first and second delay lines, multiplied by 2.

9. A method, comprising:
    selecting one of multiple phases of a source clock as a first selected clock based on a first control; and
    providing the first selected clock to a first delay line to generate a plurality of phases of the first selected clock within one of multiple phase sector of the first selected clock;
    providing the first selected clock to a first delay line to generate a plurality of phases of the first selected clock within one of multiple phase sectors of the first selected clock.

10. The method of claim 9, further including generating the plurality of phases of the first selected clock within an approximately ninety degree quadrant of the first selected clock.

11. The method of claim 9, further including:
    biasing the delay line with a delay locked loop (DLL); and
    operating the DLL at a frequency that is equal to a frequency of the source clock, multiplied by a ratio of a number of non-inverting delay stages of the DLL to a number of the phases generated by the delay line, multiplied by 2.

12. The method of claim 9, further including:
    biasing the delay line under control of a delay locked loop (DLL); and
    operating the DLL at a frequency that is less than a frequency of the clock.

13. The method of claim 9, further including:
    biasing the delay line with a delay locked loop (DLL); and
    operating the DLL at a frequency that is no more than approximately one-half of a frequency of the clock.

14. The method of claim 9, further including phase interpolating outputs of the delay line, including:
    selecting first and second ones of the plurality of phases of the first selected clock;
    applying the selected first and second phases to each of a plurality of multiplexers; and
    controlling each of the multiplexers to output one of the first and second phases to a summation node.

15. The method of claim 9, further including:
    selecting one of the multiple phases of the source clock as a second selected clock based on a second control;
    providing the second selected clock to a second delay line to generate a plurality of phases of the second selected clock within one of multiple phase sectors of the second selected clock; and
    biasing the first and second delay lines with a delay locked loop (DLL).

16. The method of claim 15, further including:
    operating the DLL at a frequency that is equal to a frequency of the source clock, multiplied by a ratio of a number of non-inverting delay stages of the DLL to a number of the plurality of phases generated by each of the first and second delay lines, multiplied by 2.

17. The method of claim 15, further including:
    operating the DLL at a frequency that is less than a frequency of the source clock.

18. The method of claim 15, further including:
    operating the DLL at a frequency that is no more than approximately one-half of a frequency of the source clock.

* * * * *